United States Patent
Sasaki et al.

[19]

[11] Patent Number: 6,144,571
[45] Date of Patent: Nov. 7, 2000

[54] SEMICONDUCTOR MODULE, POWER CONVERTER USING THE SAME AND MANUFACTURING METHOD THEREOF

[75] Inventors: Yasushi Sasaki, Funabashi; Yutaka Maeno, Yotsukaido; Hiroshi Fujii, Chiba; Kinya Nakatsu, Hitachi; Toshio Ogawa, Hitachinaka; Akihiro Tamba; Kazuji Yamada, both of Hitachi, all of Japan

[73] Assignee: Hitachi, Ltd., Tokyo, Japan

[21] Appl. No.: 09/506,269

[22] Filed: Feb. 17, 2000

[30] Foreign Application Priority Data

Feb. 22, 1999 [JP] Japan .................................. 11-042663

[51] Int. Cl.[7] .......................... H03M 7/00; H01L 23/043
[52] U.S. Cl. ........................... 363/144; 363/147; 257/687
[58] Field of Search .................................... 363/144, 146, 363/147; 257/676, 687

[56] References Cited

U.S. PATENT DOCUMENTS 5,604,674  2/1997  Terasawa ................................. 363/147
5,747,875  5/1998  Oshima .................................... 257/687
5,804,952  9/1998  Chen ................................... 363/144 X

FOREIGN PATENT DOCUMENTS 10125826  5/1998  Japan .

*Primary Examiner*—Jessica Han
*Attorney, Agent, or Firm*—Antonelli, Terry, Stout & Kraus, LLP

[57] ABSTRACT

In order to bring a moduled power converter into less size and cost in the case of a structure having a lead-insert-case, an insulated metal circuit board and a printed circuit board, a difficulty was encountered in thinning a wiring width and an increase in pad area for each metal wire has interfered with a reduction in its size and cost.

In the present invention to cope with it, a power converter is constructed by using a semiconductor module having such a structure that a metal base and lead frames are adhered to each other in a state in which an insulating adhesive sheet is interposed therebetween, a resin-molded outer package is adhered to the metal base with an adhesive or the like, and a resin sealing agent is charged into the resin-molded outer package to thereby integrally seal the resin-molded outer package and circuit parts such as semiconductor elements implemented therein, whereby a reduction in size and cost thereof is realized.

16 Claims, 14 Drawing Sheets

SEMICONDUCTOR MODULE, POWER CONVERTER USING THE SAME AND MANUFACTURING METHOD THEREOF

BACKGROUND OF THE INVENTION

1. Field of the Invention

The present invention relates to a power converter such as an inverter device, and particularly to a power converter having a hybrid integrated circuit equipped with power semiconductor elements used in a power unit and control circuit elements used in a control unit, etc.

2. Description of the Related Art

FIG. 1 shows a circuit configuration of an inverter device which is one example of a power converter. Reference numeral 1 indicates a portion used as a semiconductor module in the invention. Reference numeral 2 indicates a power unit for converting power into another one. Reference numeral 3 indicates a control unit, which is integrated in the semiconductor module 1 as needed, of a control circuit of the power converter. A control circuit 4, which is provided outside the semiconductor module 1, performs the transfer of a control signal from and to the semiconductor module 1 through a control terminal 24.

Reference numerals 43 indicate input/output terminals for connecting power's input/output lines. Reference numerals 11c indicate power semiconductor elements such as diodes for rectifying three-phase alternating current power inputted from terminals R, S and T to dc power. The power semiconductor elements 11c are connected in three-phase bridge form to constitute a power rectifier. Reference numeral 42 indicates a ballast capacitor for smoothing the dc power outputted from the power rectifier to thereby obtain a dc voltage having less voltage pulsation. The ballast capacitor 42 is mounted outside the semiconductor module 1 and its electrodes are electrically connected to P and N for the dc power. Reference numerals 11a indicate switching elements, e.g., power semiconductor elements such as IGBT, for inversely converting the dc power obtained from the power rectifier to ac power having an arbitrary frequency again. Reference numerals 11b indicate power semiconductor elements used as feedback diodes for causing a feedback current fed from a load motor 5 to flow. The power semiconductor elements 11a and 11b constitute a power inverter connected in three-phase bridge. The power inverter receives signals for switching from the control unit 3 at terminals GU through GZ and inversely converts dc power to three-phase ac power. The reversely-converted three-phase ac power is outputted from terminals U, V and W of the input/output terminal 43. The motor 5 is connected to the terminals U, V and W and driven so as to be variable in speed.

FIG. 2 shows a specific example of the semiconductor module 1 which has heretofore been implemented. The semiconductor module 1 illustrated in the conventional example is one in which the power unit 2 and the control unit 3 are integrally formed in mixed form. FIG. 2 shows a structure sectional view thereof.

In the conventional structure, an insulated metal circuit board 19 typified by an aluminum insulated circuit board or the like considering a radiation property is applied as a metal base on which power semiconductor elements 11a and 11b are mounted. A resin insulating layer 20 formed by mixing a resin and a high-thermal conductive filer together is normally provided on the side of the mounting of the semiconductor parts 11a and 11b on the insulated metal circuit board 19. Each of foil-shaped laminated conductors 14 for fixedly securing and wiring parts for the power unit and the control unit is formed on the resin insulating layer 20.

Since a low heating part like an integrated circuit 23 of the control unit requires no radiation, it is placed inside the semiconductor module 1 by using, for example, a glass epoxy cheap printed circuit board 21a. Main terminals 17 (lead terminals connected to the input/output terminals 43) and control terminals 24 (lead terminals connected to the external control circuit 4) are embedded in a resin-molded outer package 33. Parts of the main terminals 17 and control terminals 24 guided inside the resin-molded outer package 33, the respective power semiconductor elements 11a and 11b, the laminated conductor 14 on the insulated metal circuit board 19, the laminated conductor 14 on the printed circuit board 21a, etc. are electrically connected to one another by metal wires 16. Further, the surfaces of the parts lying within the resin-molded outer package 33 are filled with a resin sealing agent 32 so that the respective built-in parts are covered therewith. Since the insulated metal circuit board 19 is expensive as compared with the printed circuit board 21a, a reduction in the occupied area of the insulated metal circuit board 19 would become a large factor for a cost reduction in the present semiconductor module. However, there is a tendency that if one attempts to bring a system into one package as a product, parts to be mounted therein increase and hence the size of the insulated metal circuit board 19 is also enlarged. Since the electrical connections between the main terminals 17 corresponding to the input/output unit of the power converter, the respective power semiconductor elements 11a and 11b, the laminated conductors 14 on the insulated metal circuit board 19, etc. are made by the metal wires 16 in addition to the above, the metal wires 16 need to be provided as metal wires constructed in plural form consistent with current capacity, thus leading to an increase in the pad area (area of each wire connecting portion) for each metal wire 16 and interference with a size and cost reduction.

On the other hand, a semiconductor module structure disclosed in Japanese Unexamined Patent Publication No. Hei 10-125826 as one proposed to avoid such a problem. A sectional view of this structure is shown in FIG. 3. A lead frame 13 formed integrally with each main terminal 17 acts the role of the laminated conductor 14 shown in FIG. 2. The power semiconductor elements 11a and 11b on a metal base 15 are all mounted on the lead frame 13. The lead frame 13 electrically connects between each main terminal 17 and the power semiconductor elements 11a and 11b. As to a base plate for the semiconductor module, a metal plate of aluminum or copper is applied as the metal base 15 in place of the insulated metal circuit board 19 shown in FIG. 2. The lead frame 13 and the printed circuit board 21a are adhered to the metal base 15 with a thin insulating adhesive sheet 18 interposed therebetween. Here, the insulating adhesive sheet 18 acts the role of the resin insulating layer 20 shown in FIG. 2 and contains a thermosetting resin such as an epoxy resin as a component. This is an insulating resin sheet whose glass transfer temperature exceeds 100° C. In the present semiconductor module, the cheap metal base 15 with no insulating layer and laminated conductors formed thereon is used in place of the insulated metal circuit board 19 requiring a complex manufacturing process such as etching for forming the laminated conductors 14. The insulating adhesive sheet 18 and lead frames 13 fabricated by punching with a press or the like are adhered to the metal base 15 to thereby achieve the function equivalent to the insulated metal circuit board 19. Therefore, the cost-down of each member can be expected and the area of each pad can be reduced owing to the thinning of each wire or interconnection and a reduction in the number of the metal wires 16, thus making it possible to bring the module into less size and cost.

In the case of the structure having the resin-molded outer package 33, the insulated metal circuit board 19 and the printed circuit board 21a shown in FIG. 2, the area of the insulated metal circuit board 19 must be reduced to achieve a further reduction in the size and cost of the power converter. It is however necessary to take measures for reducing the wiring width upon reducing a board. In this case, the wiring thickness of each laminated conductor 14 needs to be increased for the purpose of maintaining current capacity. However, the range of a fabricable thickness of each laminated conductor 14 on the insulated metal circuit board 19 is relatively thin as normally in the case of a range from 70 µm to 200 µm. Therefore, the current capacity per unit wiring width is reduced so that it becomes difficult to thin the wiring width. This point of view is one factor for determining the limit of a size reduction. While the electrical connections between the main terminals 17 corresponding to the input/output unit of the power converter, the respective power semiconductor elements 11a and 11b, the laminated conductors 14 on the insulated metal circuit board 19, etc. are made by wiring bonding using the metal wires 16, a plurality of the metal wires 16 consistent with the current capacity are required, thus resulting in an increase in the area of each pad used as the connecting portion for each metal wire 16 and interfering with a reduction in size and cost.

On the other hand, the structure (transfer mold) in which the power semiconductor elements 11a and 11b and printed circuit board 21a are adhered to the metal base 15 with the insulating adhesive sheet 18 and the lead frames 13 interposed therebetween as shown in FIG. 3 needs to mold at a time. This involves the following problems:

(1) Since the resin sealing agent 32 covers the surfaces of the power semiconductor elements 11a and 11b, the integrated circuit part 23, the metal wires 16, etc., they need to be integrally molded by using a resin high in flowability. In this case, a mold for minimizing peripheral tolerance of each output terminal is required to prevent the resin from being injected round. Thus, when compared with the molded package structure shown in FIG. 2, the mold increases in cost and hence the present structure was unfit for the application to small-batch products.

(2) Stress is developed due to the expansion and shrinkage of a resin used for a molding, and a bend of a metal base increases substantially in proportion to the molding size. A limitation to its outer size is made to control its bend, so that a free system configuration could not be constructed.

(3) When one attempts to set the direction of each electrode withdrawn to the outside of a semiconductor module in the direction orthogonal to the metal base upon molding a semiconductor device, the mold becomes complex and very high in cost. Therefore, terminals are normally led out so as to become parallel to the metal base. However, in the structure wherein such terminals are guided so as to become parallel to the metal base, a large restriction is made to a connection to an external circuit when a power converter or the like is taken into consideration, so that a system including the semiconductor device cannot be reduced in size. While an external radiation fin is attached to the lower surface of the metal base to cool a semiconductor module, the guiding direction of each terminal shown in FIG. 3 has a bearing even on a problem about the distance for insulation between the external radiation fin, each main terminal and each control terminal, and the vertical height of each electrode withdrawn portion with respect to the metal base cannot be set to the insulation distance or less, whereby the height should inevitably be increased. This brings about an increase in the amount of a resin for molding and the bend of the metal base due to the expansion and shrinkage of the resin increases, thus causing a problem similar to the above (2).

(4) Since the integral formation of parts having bumps and dips or irregularities as in the case of an isolation transformer and an electrolytic capacitor necessary to construct the power converter together with lead frames needs to completely cover all the parts, a large quantity of resin is required and hence the cost thereof rises steeply so that a cheap device cannot be constructed.

SUMMARY OF THE INVENTION

In order to solve the above-described problems, a metal base and lead frames are adhered to each other in a state in which an insulating adhesive sheet is interposed therebetween, a resin-molded outer package is adhered to the metal base with an adhesive or the like. Furthermore, a resin sealing agent is charged into the resin-molded outer package, thereby integrally sealing the resin-molded outer package and circuit parts such as power semiconductor elements mounted therein.

Further, a power converter is constructed by using a semiconductor module wherein part of a metal base to which lead frames are adhered with an insulating adhesive sheet interposed therebetween and a resin-molded outer package are integrally formed, and a resin sealing agent is charged into the resin-molded outer package, thereby integrally sealing circuit parts such as power semiconductor elements mounted therein and the resin-molded outer package.

Such a construction allows a reduction in the number of metal wires by means of the lead frames and makes it possible to set the thickness of each lead frame to three or more times that of each laminated conductor on an insulated metal circuit board. Therefore, the lead frames each set narrower in width than each pattern on the insulated metal circuit board can be provided on the metal base. Thus, the area for the placement of each lead frame can be reduced and hence the metal base can be brought into less size.

Further, bumps and dips or irregularities are formed according to variations in size and form of each part necessary to constitute the power converter. However, the use of the resin-molded outer package makes it possible to minimize the amount of a resin necessary to fully cover these irregularities of portions which need covering. Namely, the required resin for molding is only an amount used for portions requiring covering, of outer packaged portions of the power converter and circuit parts incorporated therein. Thus, stress developed due to the expansion and shrinkage of the resin can be limited to the minimum, and the bend of the metal base can be relaxed. Further, the outer size can be freely selected according to the size of the power converter and a cost reduction can be achieved.

Further, a manufacturing facility necessary to form the resin-molded package is similar to commonly used outer package manufacturing equipment, and a great deal of facility investments is not required and is fit for application to small-batch products. Since each terminal is guided orthogonally to the metal base as to the position of each terminal for connecting to the outside, the degree of freedom of a layout can be sufficiently ensured.

Typical ones of various inventions of the present inventions have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

Figure 1:
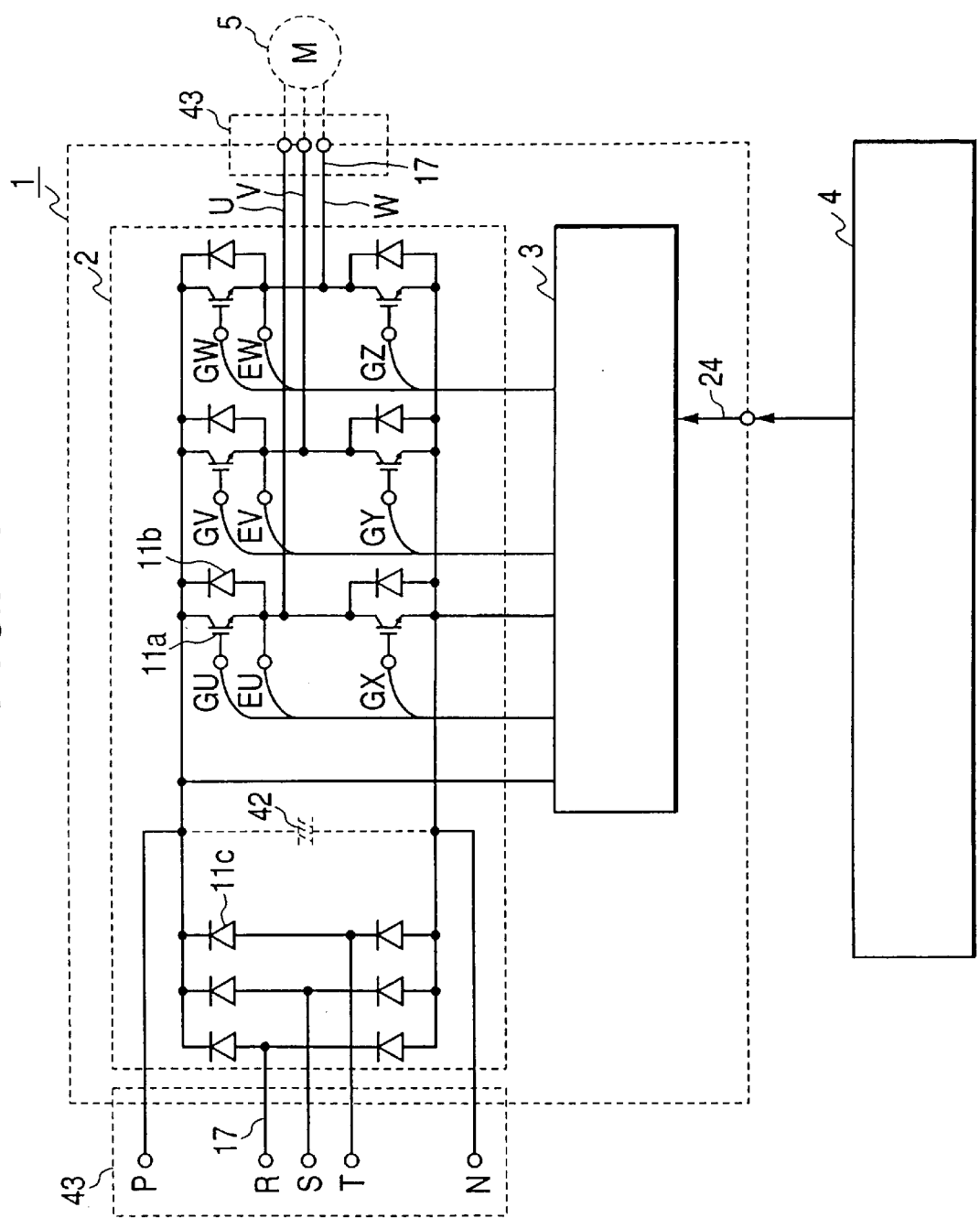
FIG. 1 is a diagram showing one example of a circuit of an inverter device used as a power converter.
Figure 4:
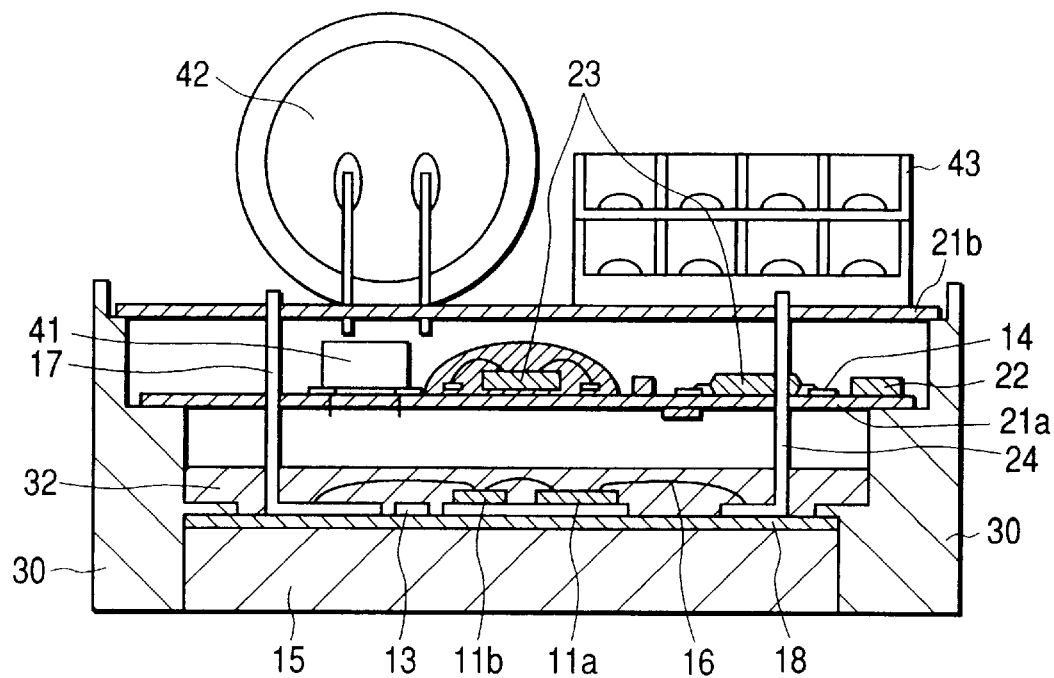
FIG. 4 is a diagram showing a sectional configuration of a power converter according to a first embodiment of the present invention.
Figure 5:
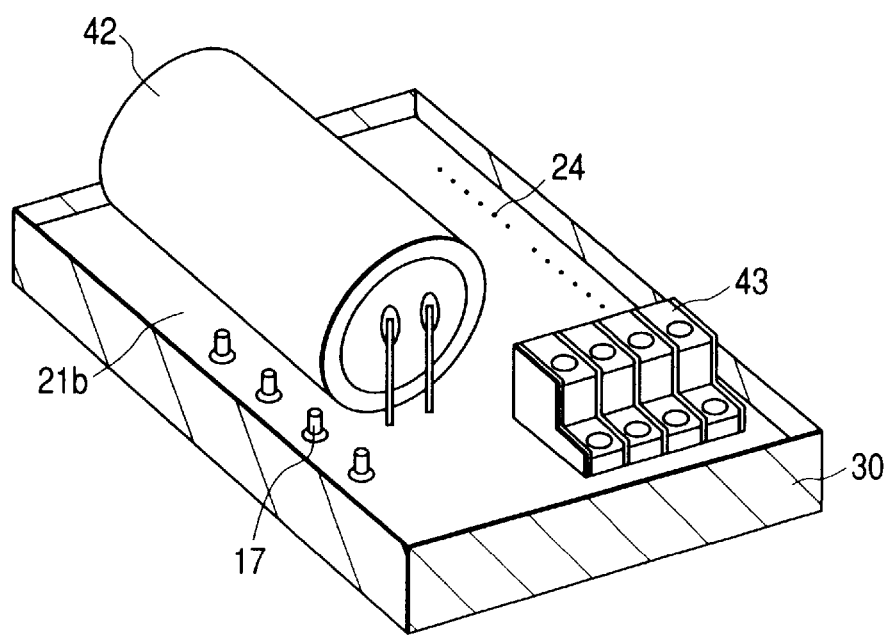
FIG. 5 is a perspective typical diagram illustrating a power converter according to the first embodiment of the present invention.
Figure 6:
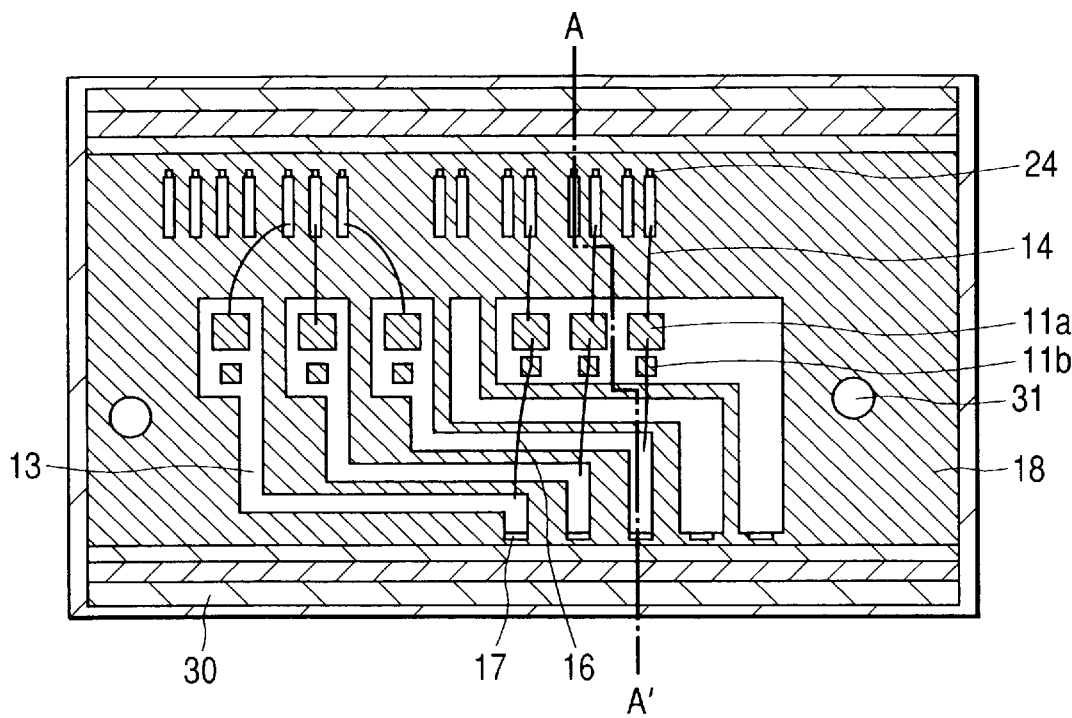
FIG. 6 is a diagram depicting an upper configuration of a semiconductor module prior to resin sealing, which is employed in the first embodiment of the present invention.

A sectional form (corresponding to a cross-sectional view of a power converter, which is taken along line A–A' of FIG. 6 shown later) of a power converter illustrated as a first embodiment of the present invention is shown in FIG. 4 with an inverter device shown in FIG. 1 as an example. FIG. 5 is a bird's-eye view of the power converter according to the present embodiment. While a top cover or the like is further included as for the power converter, it will be omitted to show an internal structure thereof. In the power converter according to the present embodiment, a semiconductor module 1 integrally formed by molding of a resin, according to the present invention is provided at the bottom of the power converter, and part of each lead frame 13 is bent so as to be guided outside the module. Main terminals 17 and control terminals 24 are electrically connected to their corresponding printed circuit boards 21a and 21b separated from a resin-molded outer package 30. A ballast capacitor 42 used as a part other than each power semiconductor element, and a terminal board or terminal 43 for wiring inputs and outputs of the power converter are mounted on the printed circuit board 21b. The terminal 43 and the main terminals 17 are electrically connected to one another by pattern interconnections formed on the printed circuit board 21b. In the present converter, a microprocessor for controlling a motor 5, integrated circuits 23 such as a driver IC, etc. for driving power semiconductor elements 11a and 11b and parts 22 for a peripheral control circuit thereof, a control power circuit, an isolation transformer 41, etc. are further mounted on the printed circuit board 21a.

Figure 2:
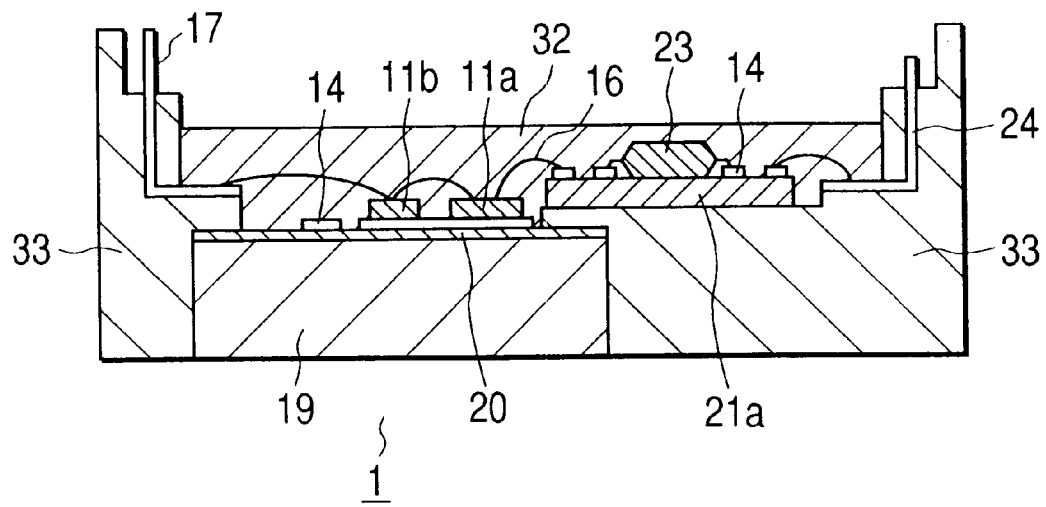
FIG. 2 is a diagram illustrating a sectional configuration of a semiconductor module according to a conventional manufacturing method.
Figure 3:
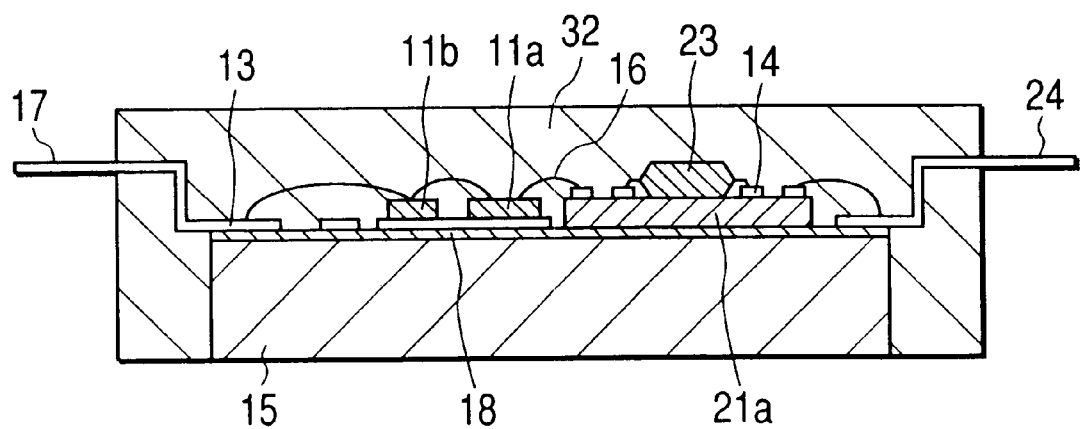
FIG. 3 is a diagram depicting a sectional configuration of a semiconductor module according to a conventional manufacturing method.

While the present embodiment is characterized by the semiconductor module in particular, a top plan view of the semiconductor module prior to resin sealing of parts is shown in FIG. 6. Here, the main terminals 17 and control terminals 24, which have led to the outside of the module, are extended over a metal base 15 inside the semiconductor module as they are, to thereby form lead frames 13. The lead frames 13 are fixed or adhered to the metal base 15 with an insulating adhesive sheet 18 interposed therebetween, and the power semiconductor elements 11a and 11b are directly mounted over the lead frames 13 by solder. Here, the insulating adhesive sheet 18 is similar to one shown in FIG. 3 and is a semicured resin sheet having characteristics of a high withstand voltage, high thermal conductivity, low coefficient of thermal expansion. The metal base 15 makes use of a metal having high thermal conductivity, which is typified by aluminum or copper. It is not necessary to form a resin insulating layer 20 and each laminated conductor 14 subjected to etching both described in the prior art shown in FIG. 2. A resin portion of the resin-molded outer package 30 and a peripheral portion of the metal base 15 are adhered with an adhesive or the like. Further, the lead frames 13, power semiconductor elements 11a and 11b, main terminals 17 and control terminals 24 are respectively electrically connected to one another by metal wires 16 typified by aluminum wires. Furthermore, necessary parts are all mounted over the metal base 15. Afterwards, the surfaces of the parts are covered with a resin sealing agent 32 such as epoxy, whereby a semiconductor module having a molded structure integrally formed with the resin-molded outer package 30 is formed. Incidentally, reference numeral 31 indicates an installation hole. Since there is no problem if an amount necessary to cover the parts 11a and 11b, metal wires 16, etc. mounted over the lead frames 13 lying within the module is used as the amount of charging of the resin sealing agent 32, the amount of the resin to be charged is minimized, so that stress developed due to the expansion and shrinkage of the resin can be limited to the minimum. Thus, the bend of the metal base 15 can be relaxed and the material cost can be reduced. Minimizing the stress means even an increase in the degree of freedom of a module size and hence the module size and form can be also optimized for the power converter. Since no facility restrictions are imposed upon manufacturing or resin sealing of the resin-molded outer package 30, the main terminals 17 and control terminals 24, which are guided outside the module, become easy to provide orthogonally to the metal base, so that the degree of freedom of a system configuration including an improvement in the connectivity with the printed circuit board 21a and a size reduction can be increased. Further, since the resin sealing agent 32 is charged inside the resin-molded outer package 30 as is distinct from a transfer mold having a structure in which the parts easy to break upon resin injection, such as the power semiconductor elements 11a and 11b, the metal wires 16, etc. are integrally molded, it is possible to reduce the cost of a mold for each of the main terminals 17, control terminals 24 and resin-molded outer package 30.

Since a control unit is low in heating value, it can be mounted on each of the low-cost and the epoxy printed circuit boards 21a and 21b. In the present embodiment, they are electrically connected to the main terminals 17 and control terminals 24 guided onto the upper surface of the integrated molded part by solder or the like. The control circuit or unit parts 22 and integrated circuit parts 23 are mounted onto the laminated conductors 14 provided over the printed circuit board 21a by solder. Further, the ballast capacitor 42, terminal 43, etc. are mounted over the printed circuit board 21b to thereby form a basic structure for the power converter. The boards and parts employed in the present embodiment are minimized in configuration as for the power converter. A further host system can be constructed as a power converter by, for example, further connecting a control substrate or board such as an external interface or the like to the present device configuration.

Figure 7:
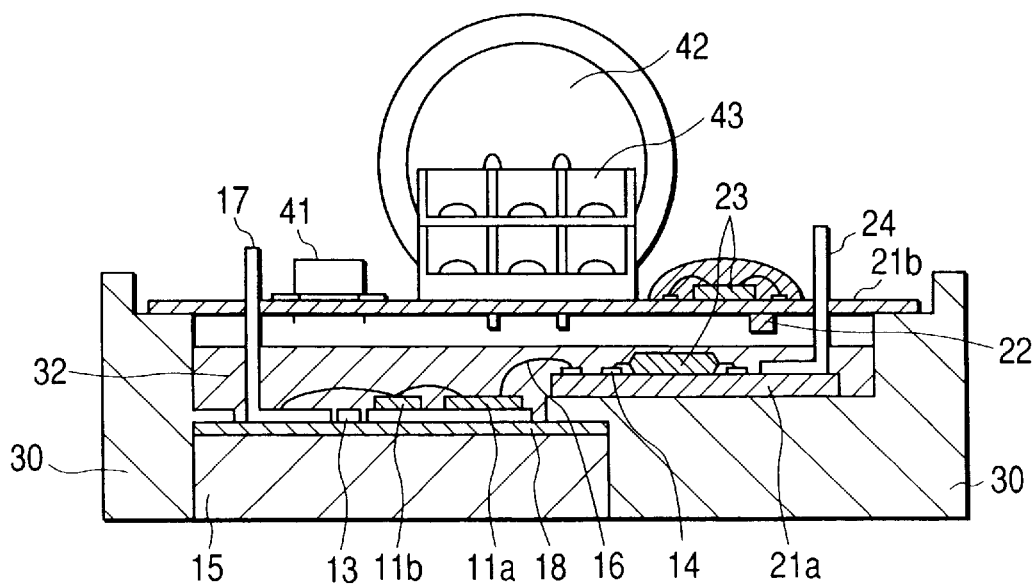
FIG. 7 is a diagram showing a sectional configuration of a power converter according to a second embodiment of the present invention.
Figure 8:
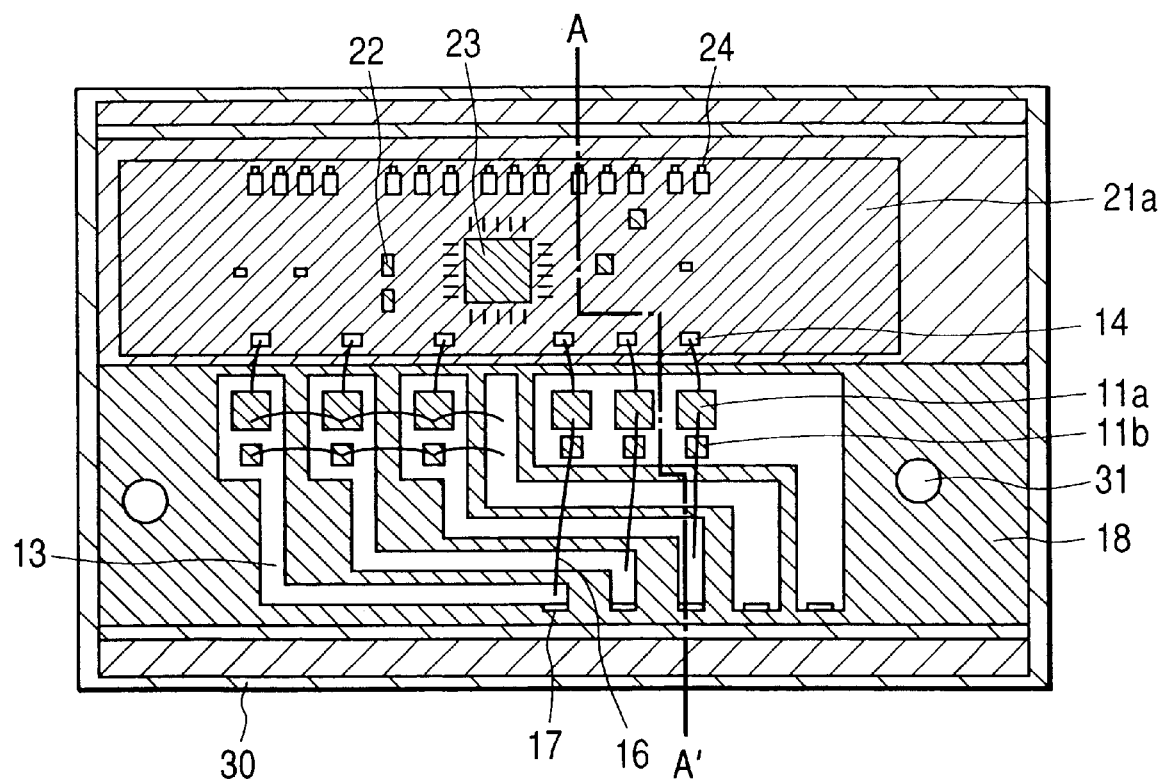
FIG. 8 is a diagram illustrating an upper configuration of a semiconductor module prior to resin sealing, which is employed in the second embodiment of the present invention.

A second embodiment is shown in FIGS. 7 and 8. The following contents may be mentioned as the difference between the second embodiment and the first embodiment. Namely, it resides in that parts of the control circuit parts 22 and integrated circuit parts 23 mounted on the printed circuit board 21a lying outside the module in FIG. 4 are mounted inside a molded module. In the present embodiment, the control terminals 24 are electrically connected to the printed circuit board 21a by solder. The printed circuit board 21a side and the power unit side are electrically connected to one another by the metal wires 16. The resin sealing agent 32 needs such a height as to be able to completely cover the parts on the printed circuit board 21a as the minimum. In the case of the present structure, the size of the printed circuit board 21a can be reduced as compared with the first embodiment and hence the module can be brought into less size. Further, since the parts provided on the printed circuit board 21a provide less generation of heat, it is not necessary to provide the metal base 15 for increasing a cooling effect therebelow. Thus, the size of the metal base 15 can be reduced with respect to only portions below the lead frames 13 for the power unit, thus bringing about an advantage even to a reduction in cost.

A main process diagram for the semiconductor device illustrated in the first embodiment (see FIG. 4) is shown in FIG. 9.

Figure 9A:
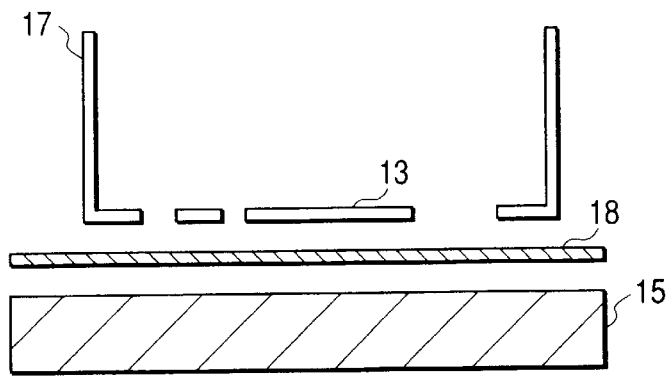
FIG. 9 is a process diagram for manufacturing the power converter according to the first embodiment of the present invention.
Figure 9B:
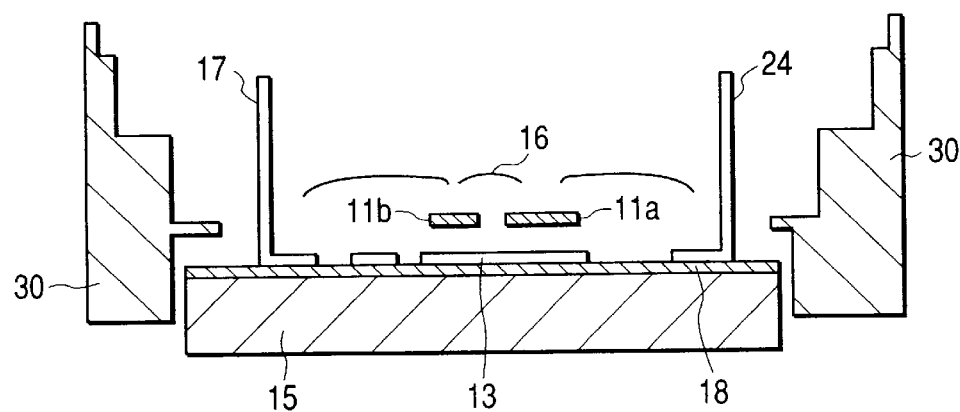
Figure 9C:
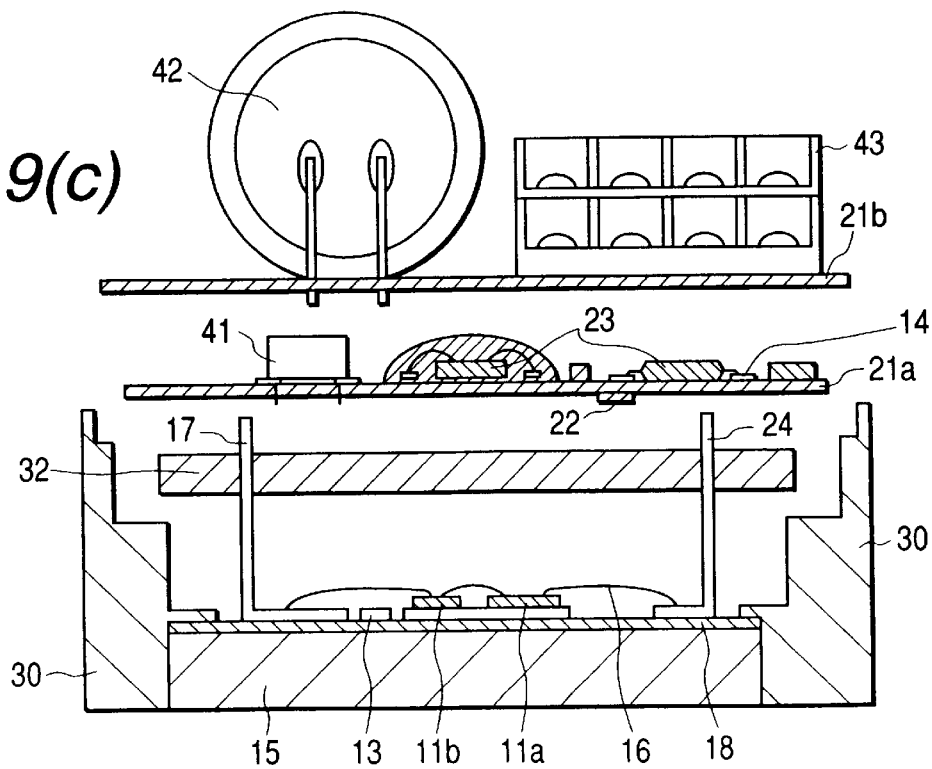

As shown in FIG. 9(a), the lead frames 13 and the metal base 15 are adhered to each other with an insulating adhesive sheet 18 interposed therebetween. As shown in FIG. 9(b), a pre-fabricated resin-molded package 30 is bonded to a body formed by adhering the lead frames 13 and the metal base 15 to each other, which body could be produced in FIG. 9(a). Further, the power semiconductor elements 11a and 11b are respectively mounted over the lead frames 13 and wired by the metal wires 16. Further, as shown in FIG. 9(c), these mounted lead frames 13 and the power semiconductor elements 11a and b are sealed with the resin sealing agent 32, and the printed circuit boards 21a and 21b with control parts and the like mounted on it, are adhered to step-provided portions of the resin-molded package 30.

Figure 10:
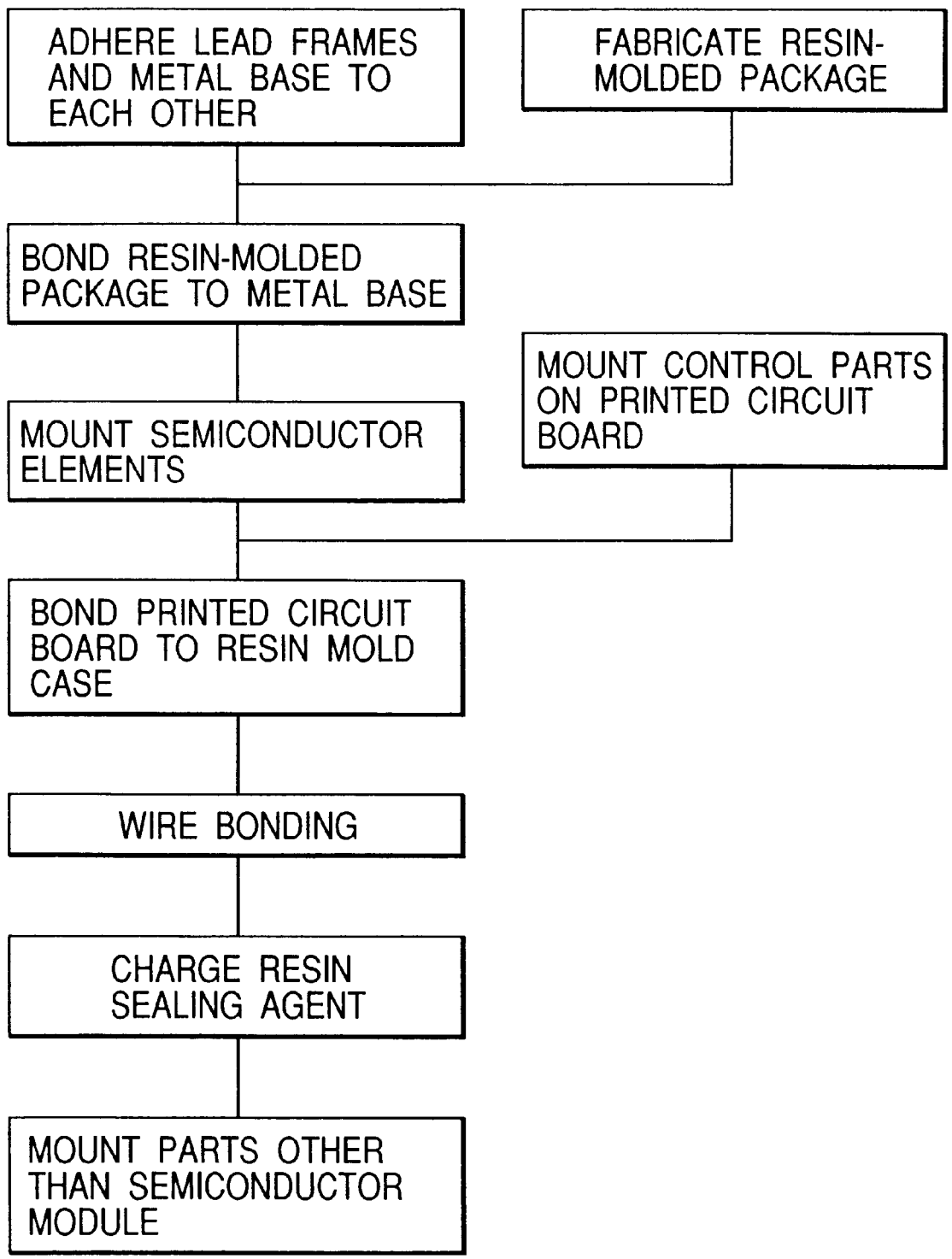
FIG. 10 is a flow for manufacturing the power converter according to the second embodiment of the present invention.

A manufacturing flow corresponding to the second embodiment (see FIG. 7) is shown in FIG. 10.

The lead frames 13 and the metal base 15 are first adhered to one another. Next, the pre-fabricated resin-molded package 30 is bonded to the body formed by adhering the lead frames 13 and the metal base 15 to each other. Further, the power semiconductor elements 11a and 11b are mounted thereon. Furthermore, the printed circuit board 21a to which control parts and the like are mounted, is bonded to the resin-molded package 30. These lead frames 13, the power semiconductor elements 11a and 11b, and control parts and the like on the printed circuit board 21a are wire-bonded to one another by the metal wires 16. Next, they are sealed with the resin sealing agent 32. The printed circuit board 21b on which parts other than the semiconductor module are mounted, is bonded onto step-provided portions of the resin-molded package 30 so as to be assembled as shown in FIG. 7.

Figure 11:
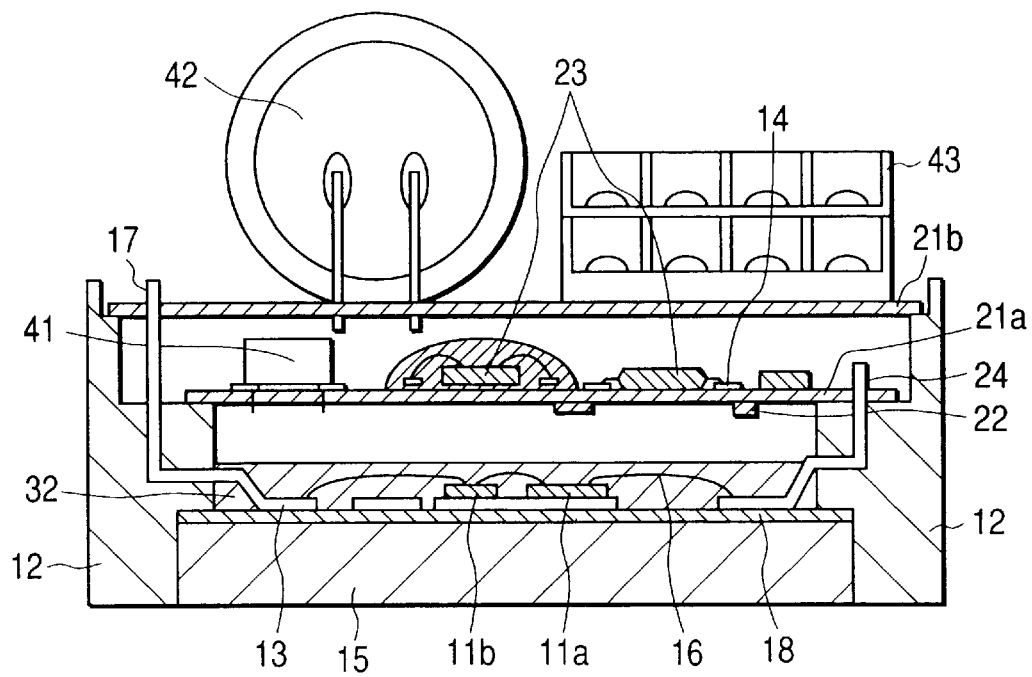
FIG. 11 is a diagram showing a sectional configuration of a power converter according to a third embodiment of the present invention.

A third embodiment is shown in FIG. 11. The present embodiment is different from the first embodiment in that a resin-molded outer package is provided as a lead frame case 12 formed integrally with lead frames 13. Thus, a process step for bonding the lead frames 13 and the resin-molded outer package 30 employed in the first embodiment to their corresponding metal base can be carried out simultaneously in a process step for bonding the lead frame case 12 to a metal base, whereby the process can be shortened. In the present embodiment, it is necessary to form bends at leads on the boundaries where the lead frames 13 are adhered to an insulating adhesive sheet 18 and provide clearances to be filled with a resin before and behind the leads. Namely, a stress applied to each lead frame 13 due to the unbalance of a thermal stress developed between the metal base 15 and the lead frame case 12 can be relaxed by covering the front and back of each lead with the resin sealing agent 32. Thus, the reliability of the strength of adhering to the same portions can be improved.

Figure 12A:
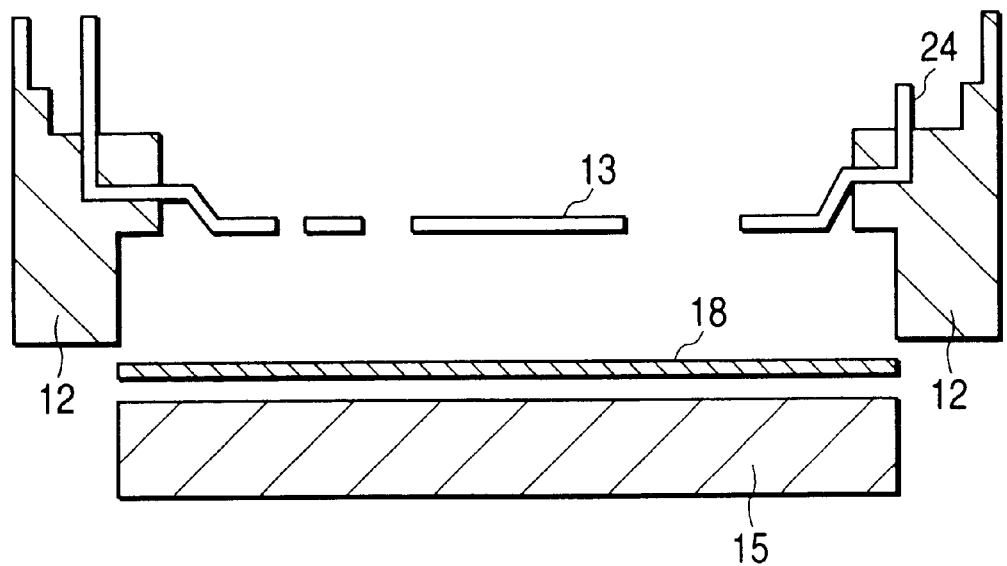
FIG. 12 is a process diagram for manufacturing a semiconductor module employed in the third embodiment of the present invention.
Figure 12B:
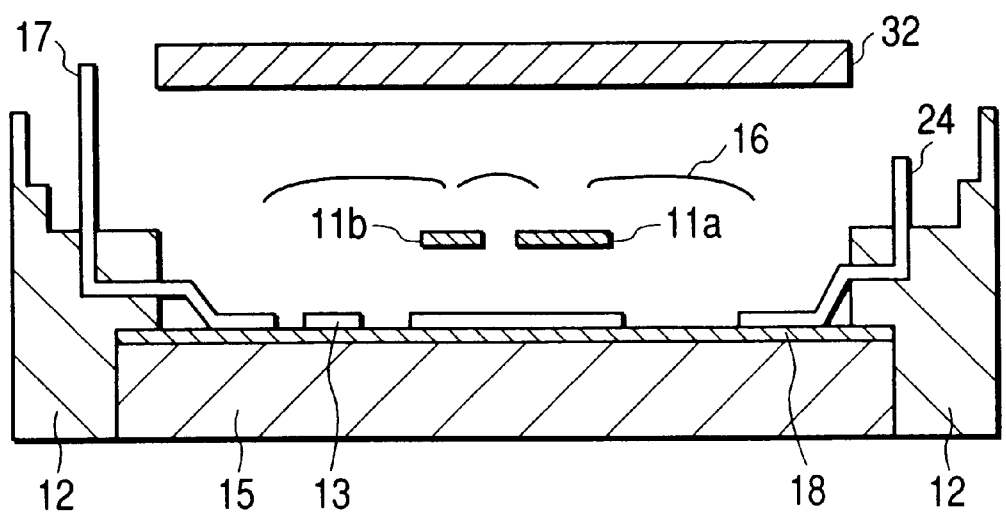

A process for manufacturing a semiconductor module in the case referred to above is shown in FIG. 12. As shown in FIG. 12(a), the present embodiment is characterized in that lead frames 13 are formed integrally with the lead frame case 12 in advance. The process proceeds in order of FIG. 12(a) and FIG. 12(b). As shown in FIG. 12(a), the lead frame case 12 in which the resin-molded outer package and the lead frames 13 are integrally formed in advance, is adhered to the metal base 15 with an insulating adhesive sheet 18 interposed therebetween. Next, the power semiconductor elements 11*a* and 11*b*, are mounted as shown in FIG. 12(*b*) and the metal wires 16 are wire-bonded thereto. They are integrally sealed so as to be covered with the resin sealing agent 32.

Figure 13:
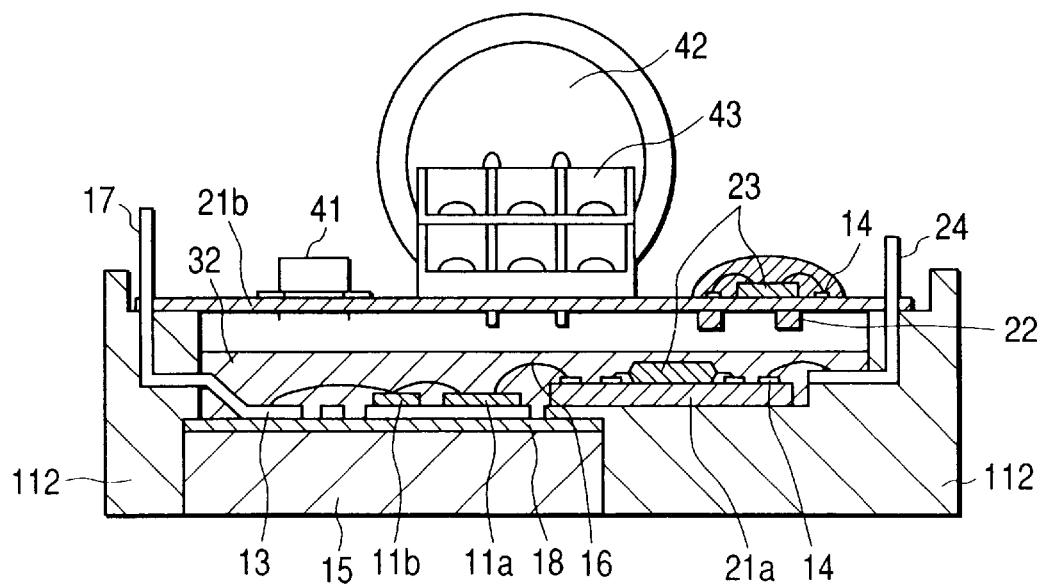
FIG. 13 is a diagram illustrating a sectional configuration of a power converter according to a fourth embodiment of the present invention.
Figure 14:
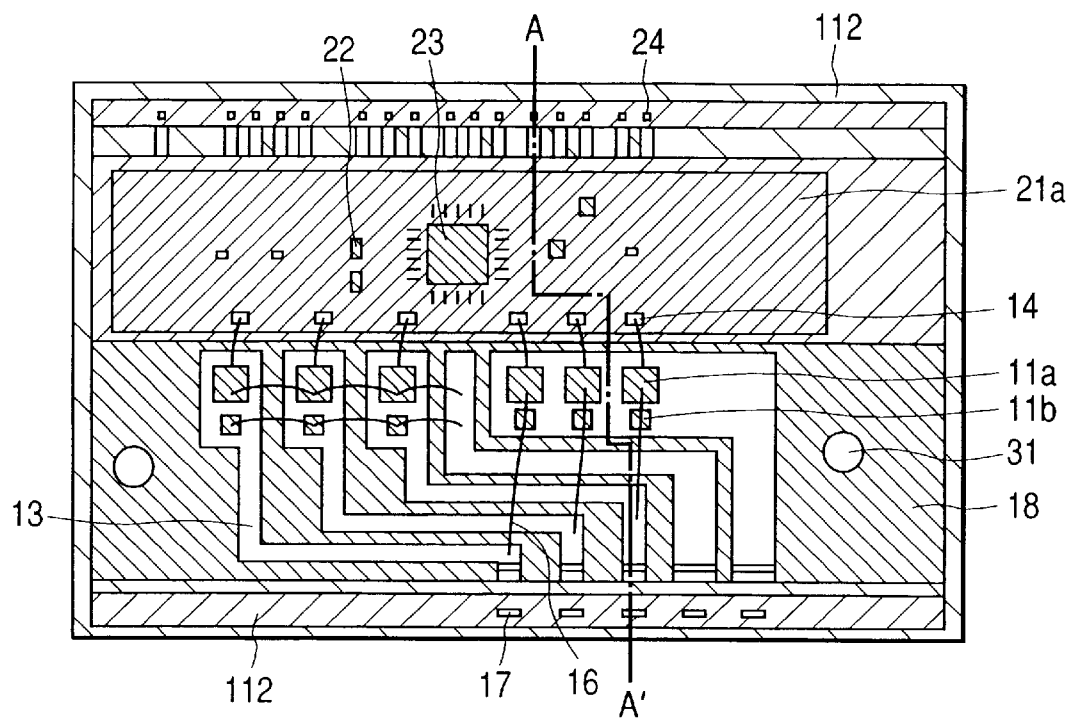
FIG. 14 is a diagram showing an upper configuration of a semiconductor module prior to resin sealing, which is employed in the fourth embodiment of the present invention.

A fourth embodiment is shown in FIGS. 13 and 14. FIG. 14 is a top view of a semiconductor module prior to resin sealing of parts. The present embodiment is different from the third embodiment in that a part of the printed circuit board 21*a* equipped with control parts is incorporated inside the semiconductor module 1 in a manner similar to the second embodiment. In a resin-molded outer package (a lead frame case 112) employed in the present embodiment, the main terminals 17 are similar in structure to the lead frame case 12 employed in the third embodiment shown in FIG. 11, whereas the control terminals 24 are similar in structure to the conventional resin-molded outer package 33. Parts on the printed circuit board 21*a* and the control terminals 24 are electrically connected to one another by the metal wires 16. The present embodiment is also characterized in that the module is reduced in size and cost as compared with the third embodiment.

Figure 15:
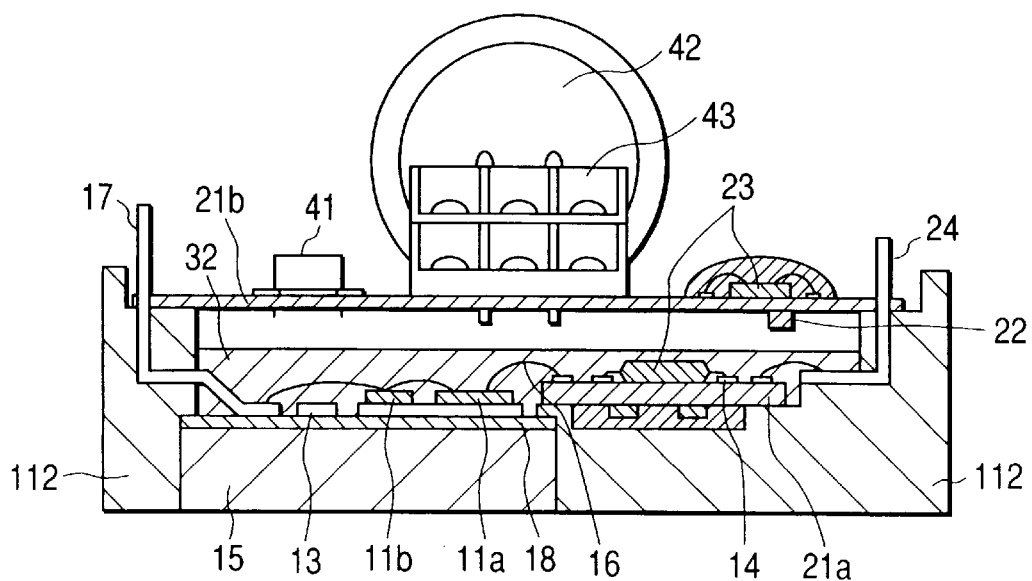
FIG. 15 is a diagram illustrating a sectional configuration of a power converter according to a fifth embodiment of the present invention.

A fifth embodiment is shown in FIG. 15. The present embodiment is different from the fourth embodiment in that the printed circuit board 21*a* can be equipped with a double-mounted printed circuit board which load parts on both surface. The present embodiment is characterized in that a portion below the printed circuit board 21*a* mounted onto the lead frame case 112 is partly lowered so that parts on the double-mounted printed circuit board are prevented from making contact with the lead frame case 112. However, since the reverse side of each bonding pad on the printed circuit board 21*a* needs to ensure bonding strength, it is necessary to keep the lead frame case 112 and the printed circuit board 21*a* in a closely bonded state. Therefore, the same portion will be restricted to only a wiring pattern. As compared with the fourth embodiment, the printed circuit board 21*a* can be further multilayered and densified and a board size can be reduced, thereby leading to a reduction in the size of the module.

Figure 16:
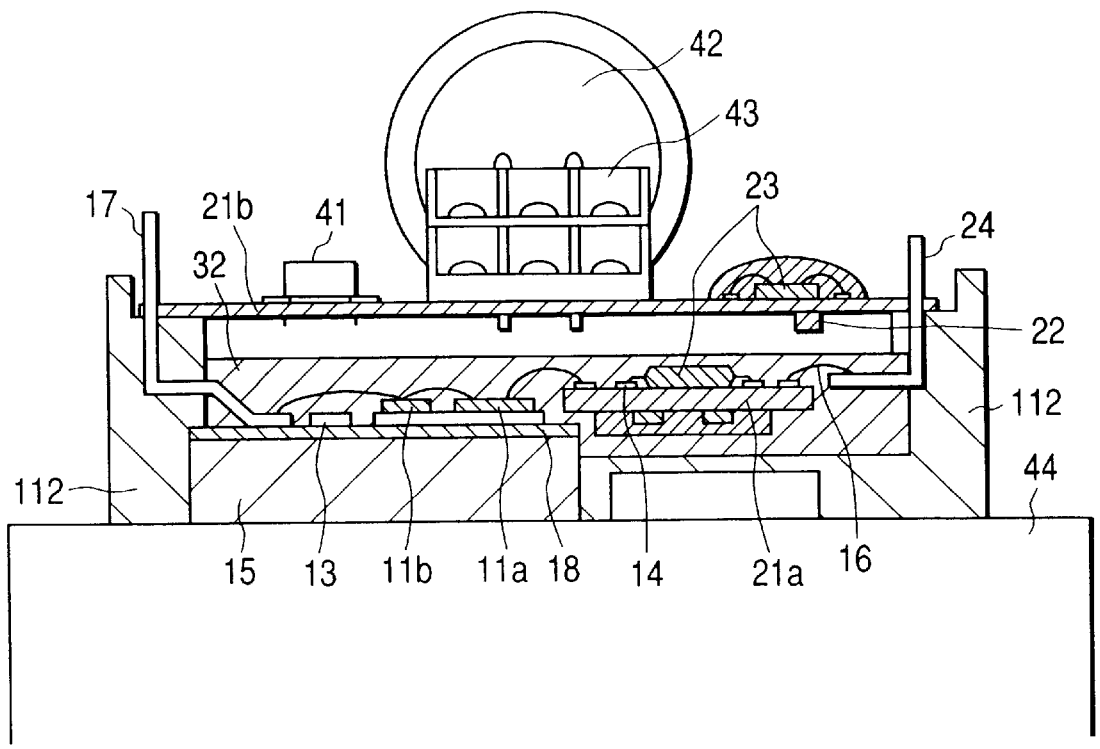
FIG. 16 is a diagram depicting a sectional configuration of a power converter according to a sixth embodiment of the present invention.

A sixth embodiment is shown in FIG. 16. The point of difference between the present embodiment and the fifth embodiment resides in a structure in which the attachment surface side of the lead frame case 112 to a radiation fin 44 is cut away at a portion below the printed circuit board 21*a*. As a result, the transfer of heat from the radiation fin 44 to the printed circuit board 21*a* at the driving of a power converter can be cut off by an air layer. Further, this side as seen in the drawing is set as the ground side and the bottom (corresponding to the attachment surface side to the radiation fin 44) of a module is attached in the direction orthogonal to the ground, whereby the air layer formed at the portion below the printed circuit board 21*a* exhibits a funnel effect to produce air convection. Therefore, this brings about the effect of restraining a rise in temperature. Thus, the part high in self heating needs to allow a module attachment surface just therebelow to make direct contact with the radiation fin 44 and to perform heat radiation therefrom. However, the cutting-off of the heat to the part such as a power unit part or the like relatively low in self heating is subjected from the radiation fin 44, is effective in controlling a rise in temperature.

Figure 17:
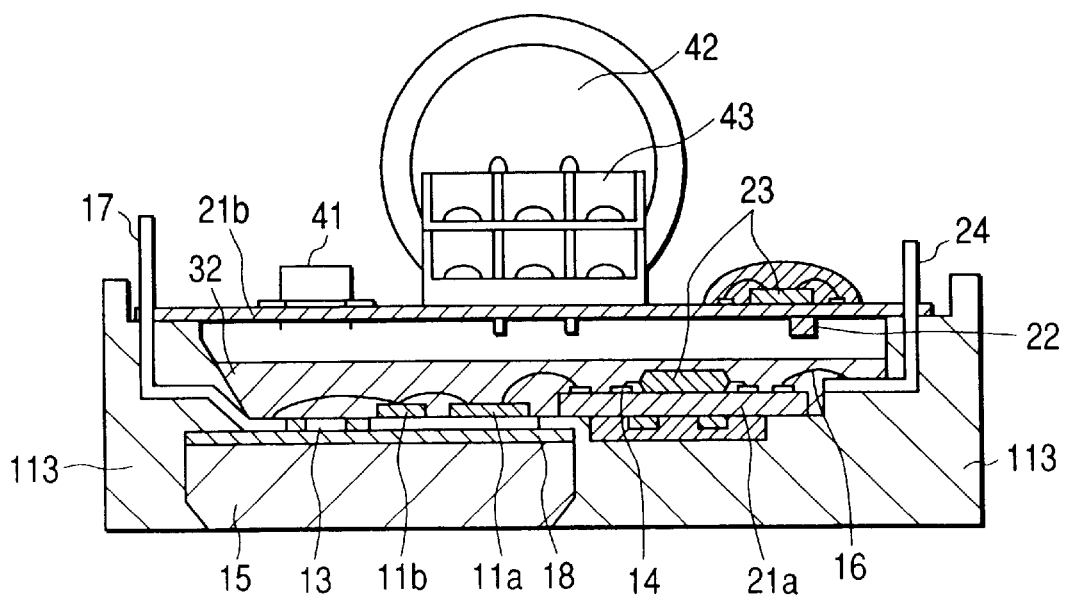
FIG. 17 is a diagram depicting a sectional configuration of a power converter according to a seventh embodiment of the present invention.
Figure 18:
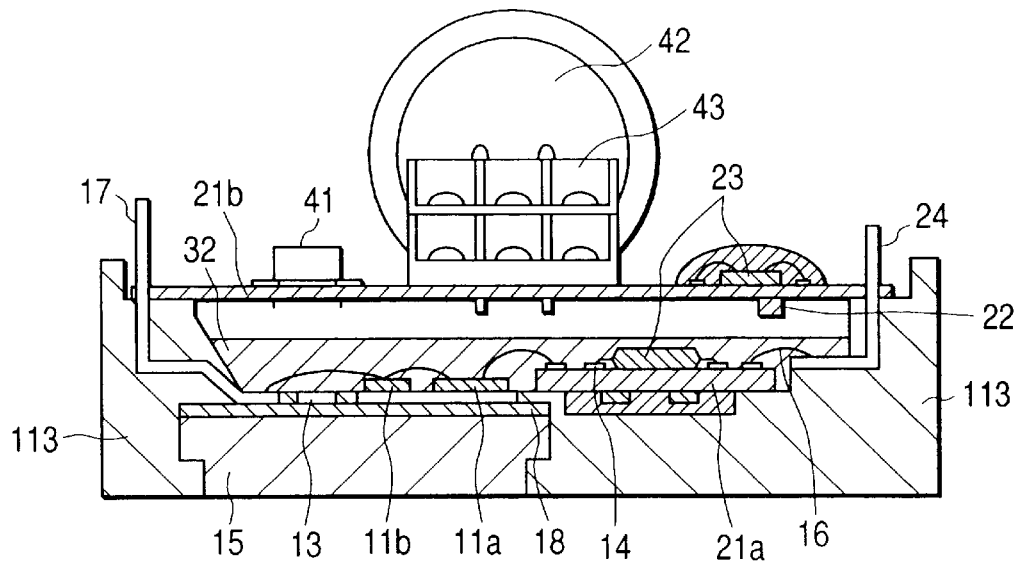
FIG. 18 is a diagram showing a sectional configuration of a power converter according to an eighth embodiment of the present invention.
Figure 19:
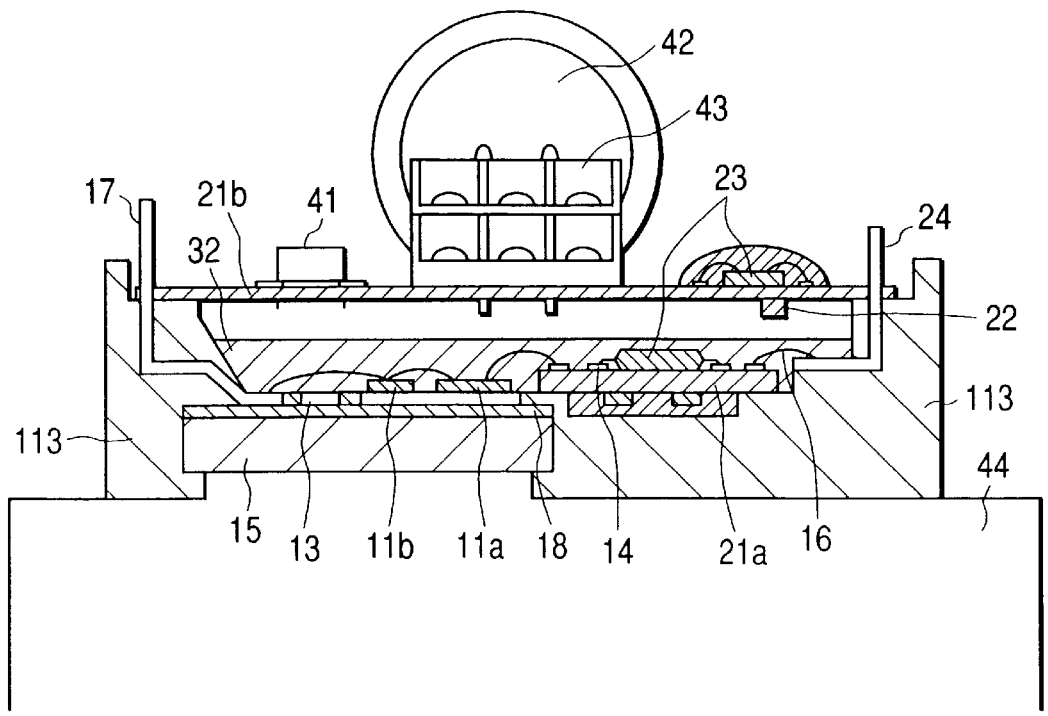
FIG. 19 is a diagram illustrating a sectional configuration of a power converter according to a ninth embodiment of the present invention.
Figure 20A:
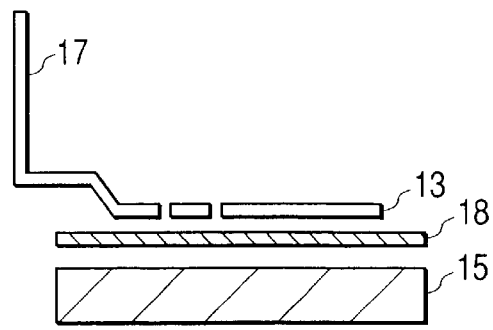
FIG. 20 is a process diagram for manufacturing a semiconductor module employed in the ninth embodiment of the present invention.
Figure 20B:
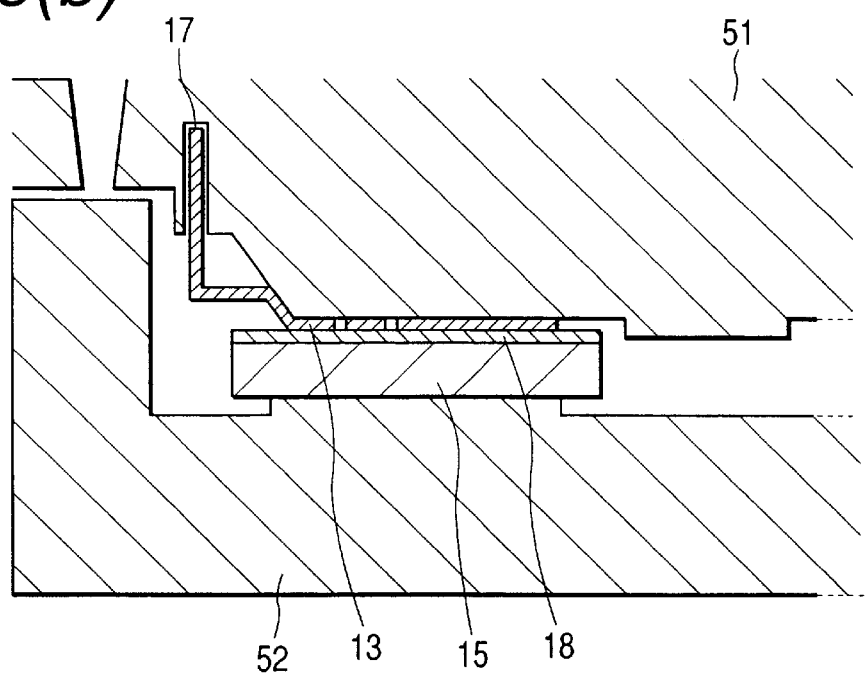
Figure 20C:
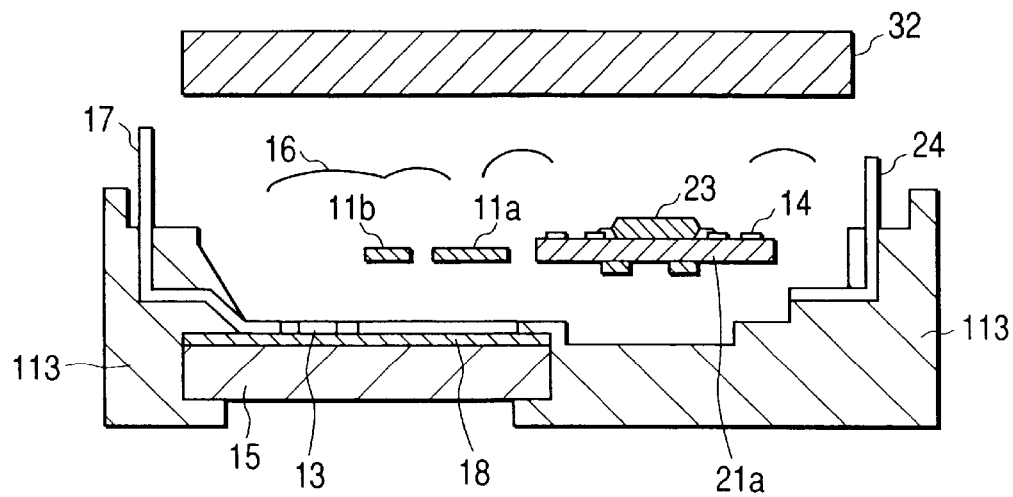
Figure 21:
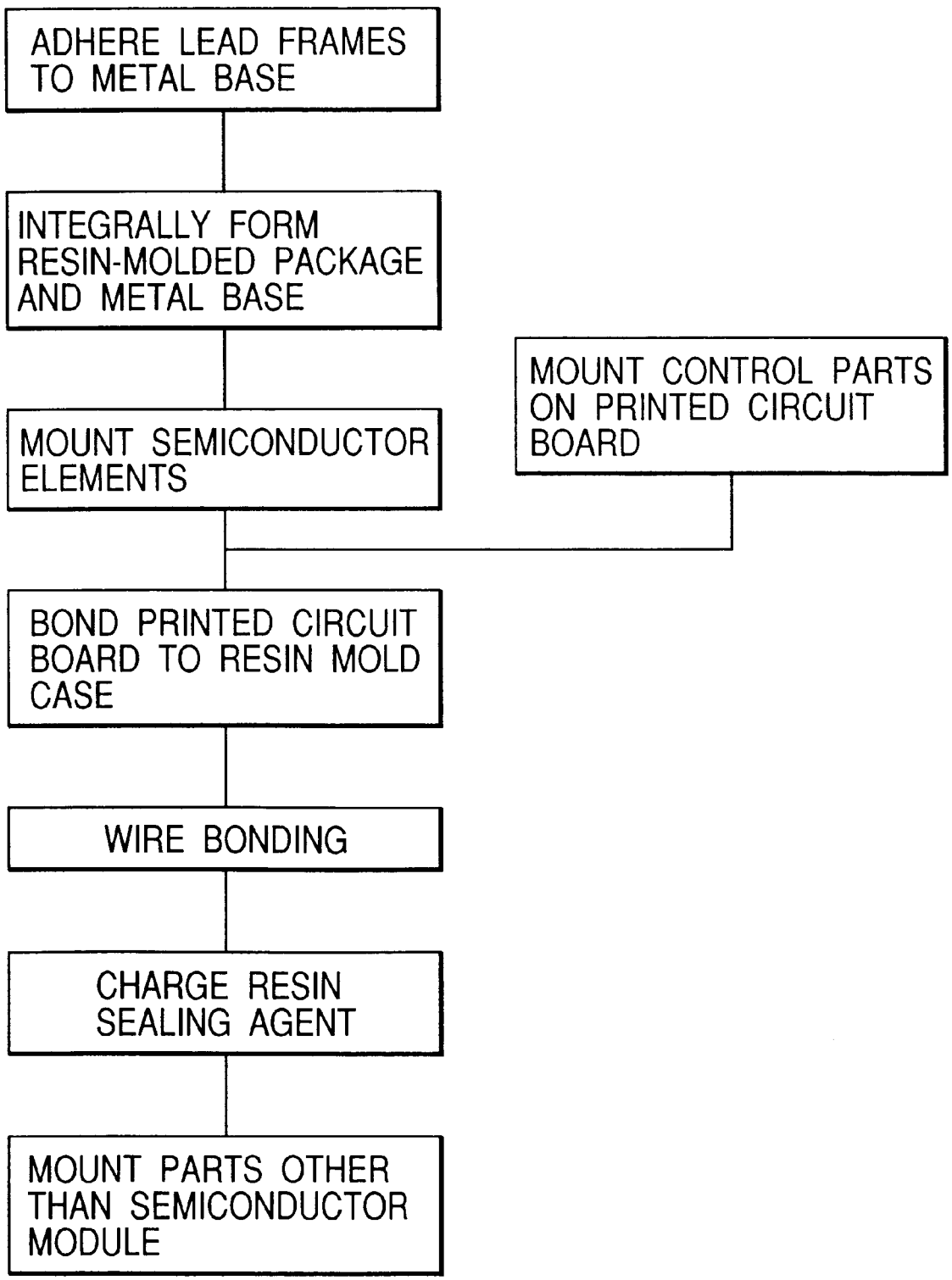
FIG. 21 is a flow for manufacturing the power converter according to each of the seventh to ninth embodiments of the present invention.

A seventh embodiment, an eighth embodiment and a ninth embodiment are respectively shown in FIGS. 17, 18 and 19. The point of difference between theses embodiments and the fifth embodiment resides in a structure in which a resin-molded outer package (a lead frame case 113) is formed integrally with the metal base 15. Namely, each lead frame 13 and the metal base 15 are adhered to each other with an insulating adhesive sheet 18 interposed therebetween. Afterwards, the end of the metal base 15, the main terminals 17 and the lead frame case 113 are integrally formed by using molds 51 and 52 shown in FIG. 20(*b*). Here, the metal base 15 is formed in advance in slant form or lock form as shown in FIGS. 17 and 18 to enhance the strength of bonding to the lead frame case 113. In FIG. 19, a similar effect can be obtained by wrapping the lead frame case 113 around the lower surface of the metal base 15. The upper mold 51 prevents the flowing of a resin onto the upper surface of each lead frame on which the power semiconductor elements 11*a* and 11*b* are mounted and the metal wires 16 are wire-bonded upon formation of the lead frame case 113, whereas the lower mold 52 integrally forms the metal base 15 and the lead frame case 113. Thus, although the resin is charged into a clearance defined between the adjacent lead frames 13 on the insulating adhesive sheet 18, no problem occurs in the subsequent part mounting if the resin is prevented from being injected onto the upper surface of each lead frame 13 as described above. A main process diagram for a semiconductor module in this case is shown in FIG. 20. A manufacturing flow corresponding to it is expressed as shown in FIG. 21. As shown in FIG. 20(*a*), each lead frame 13 and the metal base 15 are first adhered to each other with the insulating adhesive sheet 18 interposed therebetween. Next, the lead frame case 113 and the metal base 15 are integrally formed by means of the molds 51 and 52 as shown in FIG. 20(*b*). Next, the power semiconductor elements 11*a* and 11*b* are mounted as shown in FIG. 20(*c*). One obtained by mounting the control part 23 onto the printed circuit board 21*a* in advance is bonded to the lead frame case 113. These power semiconductor elements 11*a* and 11*b*, lead frames 13 and printed circuit board 21*a* are wire-bonded to each other by the metal wires 16 and sealed with the resin sealing agent 32.

Further, the printed circuit board 21*b* are mounted onto the semiconductor module as shown in FIG. 19.

As is understood by comparing FIGS. 20 and 21 with FIG. 10 showing the manufacturing flow of the second embodiment, the process for bonding the resin-molded outer package 30 to the metal base 15 can be omitted and an effect related to a reduction in cost can be expected.

While the specific embodiments have been described by the inverters respectively as described above, the structure of the semiconductor module according to the present invention is not limited to the inverter and may be applied even to another power converter.

According to the present invention, the following effects are brought about:

(1) By fulfilling the role similar to an insulated metal circuit board by a metal base, an insulating adhesive sheet and lead frames without having to use the insulated metal circuit board, a substrate or board cost, which makes up a large cost rate of the module, can be greatly reduced.

(2) The thickness of each lead frame can be ensured over three or more times the thickness of an insulated metal base. Thus, an increase in the thickness of each lead frame and a reduction in the width thereof make it possible to reduce the total wiring area of a power wiring portion, bring the metal base into less size and reduce the size of a module while ensuring equivalent current capacity.

(3) By using a resin-molded outer package in a module structure comprised of lead frames, an insulating adhesive sheet and a metal base, and filling it with a resin sealing agent to thereby sealing it therewith, the cost of each mold, which has posed a problem upon fabrication of a semiconductor device by the conventional transfer mold, can be reduced. Hence this can be applied even to small-batch fabricated products.

(4) Since the flatness of a metal base subsequent to the formation of a mold can be easily ensured as compared with one manufactured by the transfer mold, a module size which could not be fabricated by the transfer mold, could be also produced.

(5) Since terminals guided from a module are easily pulled out in the direction orthogonal to a metal base as is distinct from the transfer mold, the degree of freedom related to the connection with a module external board is high and hence the present structure can be reduced in size as a power converter.

According to the achievement of the above-described effects, it can be said that the module structure according to the present invention is effective in reducing the size and cost of the module after having ensured reliability and functions.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A power converter, comprising:
    a semiconductor module incorporating therein a power unit comprised of a power semiconductor and a control unit for controlling the power semiconductor, said power unit including power semiconductor elements adhered onto lead frames respectively and said control unit including control semiconductor elements such as a microcomputer mounted on a printed circuit board, and
    wherein said power semiconductor elements are electrically connected to each other by said lead frames,
    said lead frames are adhered to a metal base with a resin insulating layer interposed therebetween,
    a resin-molded outer package is adhered to said metal base, and
    said resin-molded outer package is filled with a resin therein, whereby said lead frames and said power semiconductor elements on said lead frames are sealed by said resin within said resin-molded package.

2. The power converter according to claim 1, wherein said semiconductor module has a structure in which part of said each lead frame is formed integrally with the resin-molded outer package.

3. The power converter according to claim 1, wherein part of said each lead frame and part of said metal base are formed integrally with the resin-molded outer package.

4. The power converter according to claim 1, wherein said resin-molded outer package has a printed circuit board therein, said control unit is mounted on the printed circuit board, said lead frames and said power semiconductor elements provided thereon and said control unit and external connecting terminals are respectively electrically connected to one another by metal wires, a resin is charged into said resin-molded outer package, and said lead frames, said power semiconductor elements and said printed circuit board, said control unit mounted on said printed circuit board and said metal wires are sealed with a resin sealing agent.

5. The power converter according to claim 4, wherein said printed circuit board is a printed circuit board which load parts on both surface, and a support portion to which said printed circuit board is adhered is provided just below a portion where at least the metal wires are connected to the printed circuit board.

6. The power converter according to claim 4, wherein said printed circuit board is provided within said resin-molded outer package, and said resin-mold package has a space for convecting air within provided at the bottom surface thereof and at the portion below said printed circuit board.

7. A semiconductor module, comprising:
    a power unit comprised of a power semiconductor; and
    a control unit for controlling the power semiconductor, said power unit and said control unit being incorporated in said semiconductor module, and
    wherein said power unit includes power semiconductor elements adhered onto lead frames, said control unit includes control semiconductor elements such as a microcomputer mounted on a printed circuit board, said power semiconductor elements are electrically connected to one another by said lead frames, said each lead frame is adhered to a metal base with a resin insulating layer interposed therebetween, a resin-molded outer package is adhered to said metal base, and a resin is charged into said resin-molded outer package so that said lead frames lying within said resin-molded outer package and said power semiconductor elements on said lead frames are sealed.

8. The semiconductor module according to claim 7, which has a structure in which part of said each lead frame is overall formed with the resin-molded outer package.

9. The semiconductor module according to claim 7, wherein part of said each lead frame and part of the metal base are overall formed with the resin-molded outer package.

10. The semiconductor module according to claim 7, wherein said resin-molded outer package has a printed circuit board therein, said control unit is mounted on the printed circuit board, said lead frames, said power semiconductor elements provided on said load frames, said control unit and external connecting terminals are respectively electrically connected to one another by metal wires, a resin is charged into said resin-molded outer package, and said lead frames, said power semiconductor elements and said printed circuit board, said control unit and said metal wires are sealed by a resin sealing agent.

11. The semiconductor module according to claim 10, wherein said printed circuit board is a printed circuit board which load parts on both side, and a support portion to which said printed circuit board is adhered is provided just below a portion where at least the metal wires are connected to the printed circuit board.

12. The semiconductor module according to claim 10, wherein said printed circuit board is provided within said resin-molded outer package, and said resin-molded package has a space for convecting air within provided at the bottom surface thereof and at the portion below said printed circuit board.

13. A method of manufacturing a power converter using a semiconductor module incorporating therein a power unit comprised of a power semiconductor and a control unit for controlling the power semiconductor, comprising the following steps:

a step for adhering lead frames to a metal base so as to interpose an insulating layer therebetween;

a step for bonding said metal base and a resin-molded outer package to each other;

a step for adhering semiconductor elements onto said lead frames and a printed circuit board;

a step for electrically connecting said lead frames and said semiconductor elements by metal wires; and a step for charging a resin into said resin-molded outer package to thereby seal the lead frames and the semiconductor elements lying within said resin-molded outer package.

14. The method according to claim 13, further including a step for forming part of said each lead frame and part of said metal base integrally with said resin-molded outer package.

15. A method of manufacturing a semiconductor module incorporating therein a power unit comprised of a power semiconductor and a control unit for controlling the power semiconductor, comprising the following steps:

a step for adhering lead frames to a metal base so as to interpose an insulating layer therebetween;

a step for bonding said metal base and a resin-molded outer package to each other;

a step for adhering semiconductor elements onto said lead frames and a printed circuit board;

a step for electrically connecting said lead frames and said semiconductor elements to one another by metal wires; and a step for charging a resin into said resin-molded outer package to thereby seal the lead frames and the semiconductor elements lying within said resin-molded outer package.

16. The method according to claim 15, further including a step for forming part of said each lead frame and part of said metal base integrally with said resin-molded outer package.

* * * * *